United States Patent [19]

Fraser

[11] 4,046,660
[45] Sept. 6, 1977

[54] SPUTTER COATING WITH CHARGED PARTICLE FLUX CONTROL

[75] Inventor: David Bruce Fraser, Berkeley Heights, N.J.

[73] Assignee: Bell Telephone Laboratories, Incorporated, Murray Hill, N.J.

[21] Appl. No.: 645,087

[22] Filed: Dec. 29, 1975

[51] Int. Cl.² .................................................. C23C 15/00
[52] U.S. Cl. ........................... 204/192 C; 204/192 S; 204/192 P; 204/192 D; 204/298
[58] Field of Search ............................... 204/192, 298

[56] References Cited

U.S. PATENT DOCUMENTS

| | | | |
|---|---|---|---|
| 2,239,642 | 4/1941 | Burkhardt et al. | 204/192 |
| 3,616,450 | 10/1971 | Clarke | 204/298 |
| 3,669,860 | 6/1972 | Knowles et al. | 204/192 |
| 3,711,398 | 1/1973 | Clarke | 204/298 |
| 3,884,793 | 5/1975 | Penfold et al. | 204/298 |
| 3,897,325 | 7/1975 | Aoshima et al. | 204/298 |
| 3,956,093 | 5/1976 | McLeod | 204/192 |

FOREIGN PATENT DOCUMENTS

| | | | |
|---|---|---|---|
| 1,690,689 | 2/1972 | Germany | 204/298 |
| 1,358,411 | 7/1974 | United Kingdom | 204/192 R |

Primary Examiner—John H. Mack
Assistant Examiner—Aaron Weisstuch
Attorney, Agent, or Firm—Allen N. Friedman

[57] ABSTRACT

Substrate heating during sputter coating, due to charged particles, is controlled by the use of an auxiliary magnet in the vicinity of the substrate. The magnet is arranged to either increase this charge particle flux, in situations in which additional heating is desired, or reducing this charge particle flux in situations in which heating is detrimental (e.g., the sputter coating of heat sensitive substrates such as polymer films).

6 Claims, 5 Drawing Figures

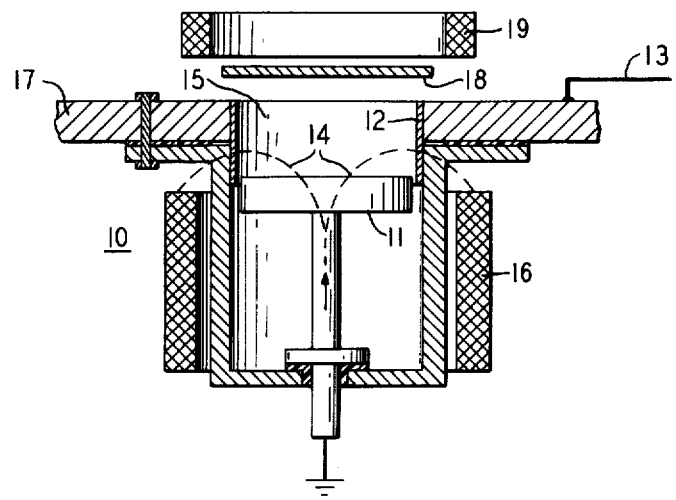
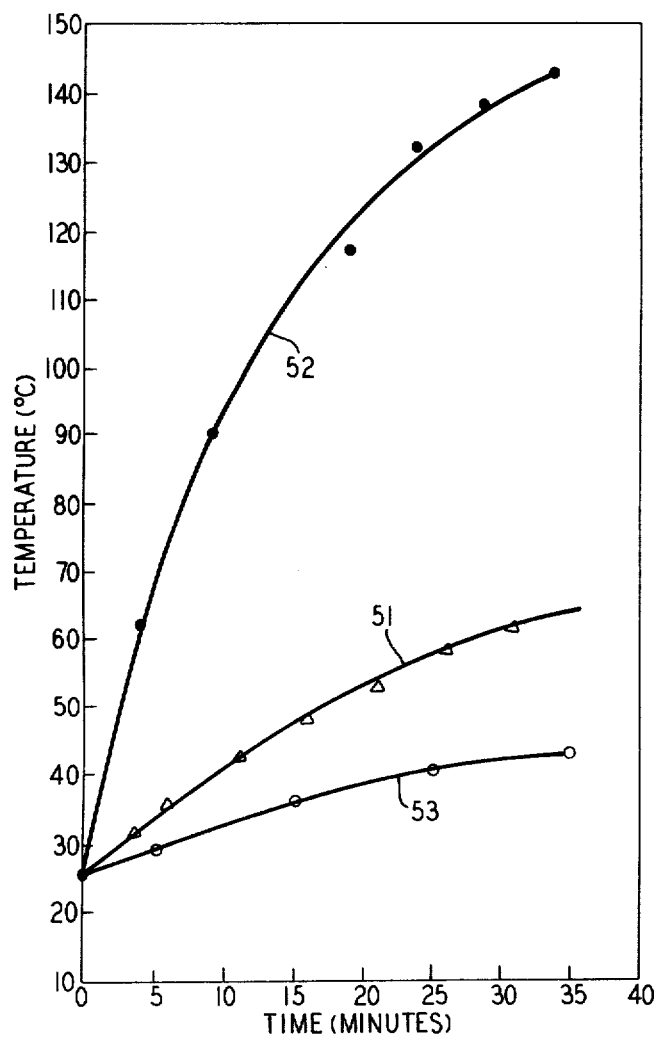

SPUTTER COATING WITH CHARGED PARTICLE FLUX CONTROL

BACKGROUND OF THE INVENTION

1. Field of the Invention

The invention is in the field of sputter coating processes.

2. Brief Description of the Prior Art

Sputtering is a thin film coating process which makes use of a plasma discharge in a sputtering gas to bombard a body of the material to be sputtered (sometimes known as the "target"). Because of the ion bombardment, neutral atoms of the sputtered material are ejected from the target surface and are deposited on the substrate to be coated. In order to sustain the plasma discharge a certain minimum gas pressure is required in the closed sputtering chamber. For several reasons it is often desirable to maintain the pressure of the sputtered gas at as low a value as possible. A class of sputtering sources has been developed which permits the use of relatively low gas pressures. (See, for example, U.S. Pat. No. 3,616,450 issued Oct. 26, 1971; and U.S. Pat. No. 3,711,398 issued Jan. 16, 1973.) This source employs, among other things, a magnetic field in the plasma region, to increase the path length of electrons, thus increasing the probability of an ionizing collision. This permits a plasma to be sustained in lower gas pressures than otherwise possible. However, using such a source the substrate to be sputter coated, which must be situated relatively close to the source, is in the fringing field of the source magnet. This fringing field has the subsidiary effect of guiding some charged particles (principally electrons) to the substrate, producing an incident charged particle flux. This charge particle flux produces heating of the substrate over and above the substrate heating which is inherent in the sputtering process, due to the flux of neutral particles of the sputtered material. In some situations this heating may be considered beneficial, for example, where it provides in situ annealing of the sputtered film. However, in some situations such heating may be detrimental, for example, if the substrate is degraded by heating. An example of the latter is the deposition of metals on certain polymer films.

SUMMARY OF THE INVENTION

A method has been found to control the incidental charge particle flux impinging on a sputtered substrate from a magnetic field sputtering source, in order to either increase or decrease the substrate heating produced by this flux. This method makes use of an auxiliary magnet situated, in the vicinity of the substrate, to produce a magnetic field at the substrate which either adds to or reduces the fringing field of the sputtering source magnet. If this additional magnetic field is imposed on the substrate in a field-aiding configuration the charged particle flux is concentrated on the substrate thus enhancing the substrate heating effect. This process can be used to produce high temperature sputtering without requiring the use of subsidiary substrate heaters. If the auxiliary magnetic field is arranged so as to oppose the fringing field, the charged particles are deflected from the substrate reducing the charged particle flux and its heating effect. The inventive process in this form can be used to deposit sputtered films on heat sensitive substrates or to permit more rapid sputtering at any given permissible heating level.

BRIEF DESCRIPTION OF THE DRAWINGS

FIG. 1 is an elevational view in section of an exemplary apparatus for the practice of the inventive process;

FIG. 5 is a set of curves of substrate temperature as a function of time in an exemplary prior art process and in processes of the invention.

DETAILED DESCRIPTION OF THE INVENTION

DC Sputtering

Figure 2:
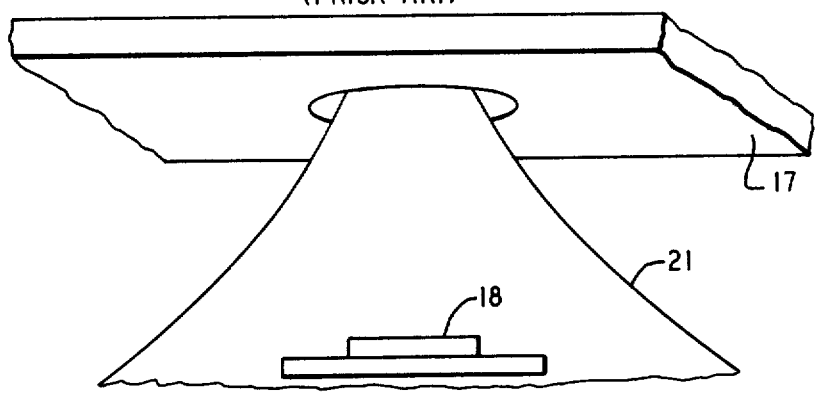
FIG. 2 is a perspectie view of a portion of a prior art sputtering apparatus.

DC sputtering is a thin film deposition process in which a large DC voltage, maintained between two electrodes in a partially evacuated chamber, produces a plasma discharge in the residual gas (sometimes termed the "sputtering gas"). The positive ions of the plasma bombard the cathode, which is constructed of the material to be sputtered which may be metallic, insulating or semiconductive. This ion bombarbment produces the ejection of neutral atoms from the cathode. The atoms are deposited on a substrate positioned in the vicinity of the cathode. This process requires that there be sufficient gas pressure in the sputtering chamber to sustain the discharge. However, the gas also reduces the main free path of the ejected atoms, thus tending to interfere with the deposition process and tending to contaminate the deposited layer.

In order to permit the use of reduced gas pressures magnetic field aided sputtering sources were developed (see, for example, U.S. Pat. No. 3,711,398 issued Jan. 16, 1973). In such sputtering sources a magnetic field is applied to the plasma discharge region, forcing the electrons to travel in a spiral path, thus increasing their path length. This increases the collision probability per electron, thereby permitting the use of lower gas pressures. Such a sputtering source is illustrated in FIG. 1 which shows a grounded anode 11 and a cathode shell 12 of the material to be sputtered which is maintained at a large negative potential through the bias lead 13. A magnetic field, schematically indicated in part by the dashed lines 14, is imposed on the plasma discharge region 15 by means of a magnet 16 (which may be a permanent magnet or an electromagnet). The source 10 is shown as being bolted to the base plate 17 of a partially evacuated chamber. The substrate to be sputter coated 18 is positioned in the vicinity of the cathode 12 so that atoms of the cathode material will fall on the substrate produced by the desired sputtered layer.

A wide variety of materials can be sputter deposited. Metals such as copper, gold and tantalum are commonly sputtered. Semiconductive materials, such as cadmium zinc sulfide, indium tin oxide and zinc oxide are deposited, for example, for their photosensitive conductivity or for their transparent but conductive properties. Insulators, such as $SiO_2$, can also be sputter deposited.

In order to capture a sufficiently large fraction of the ejected atoms the substrate 18 must be positioned relatively close to the cathode 12 and will, thus, be in the fringing field of the magnet 16. Fringing fields of the order of $10^{-2}$ w/m² are typical of observed fringing fields in such apparatus. Since free charged particles tend to follow magnetic field lines, this fringing field tends to guide charged particles (principally electrons) to the substrate 18. This flux of charged particles produces heating of the substrate over and above that heating inherent in the flux of the desired neutral atoms of sputtered material. This charged particle flux is visible as a glow in the sputtering chamber, due to recombination radiation. FIG. 2 shows, in somewhat schematic form, the position of a typical glow region 21 in the space between the base plate 17 and the substrate 18 and shows that in this prior art situation the region of charged particle flux encompasses the substrate 18. The heating effect of this charged particle flux is indicated in FIG. 5 where curve 51 shows the temperature as a function of time of thermally isolated copper block placed as a substrate in an exemplary prior art situation, such as illustrated in FIG. 2.

Charged Particle Flux Control

In accordance with the invention the flux of charged particles incident on a substrate from a magnetic field aided sputtering source is increased or decreased by the imposition of an additional magnetic field on the substrate, which field is arranged to, respectively, increase or decrease the net magnetic field strength at the substrate. This additional magnetic field is produced (see FIG. 1) by the positioning of an auxiliary magnet 19 in the vicinity of the substrate. This magnet may be a permanent magnet or an electromagnet and is of a geometry, typically corresponding to the geometry of the source magnet 16, designed to produce the desired aiding or deflecting field.

Figure 3:
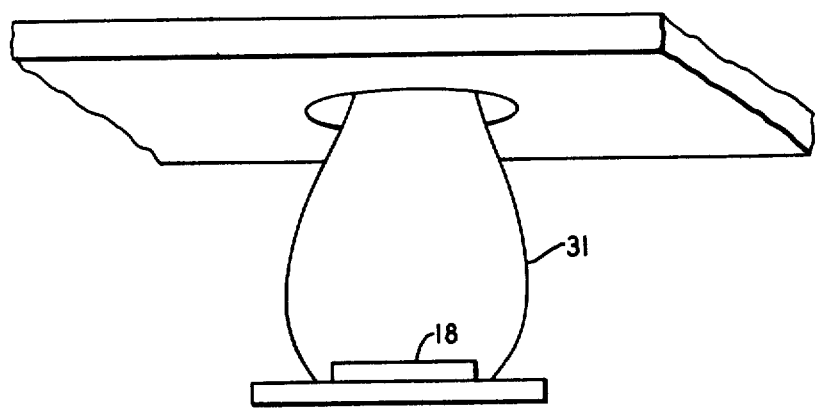
FIG. 3 is a perspective view of a sputtering apparatus illustrating the concentrating effect of the novel process in the field aiding configuration.
Figure 4:
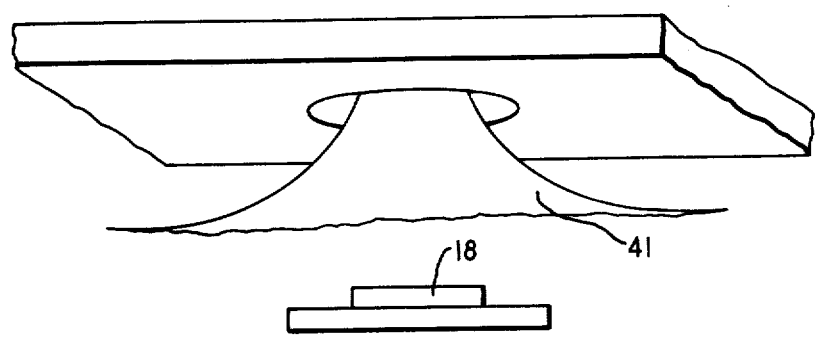
FIG. 4 is a perspective view of a sputtering apparatus illustrating the concentrating effect of the novel process in the field opposing configuration.

If the magnetic field imposed on the substrate 18 between auxiliary magnet 19 is in a field aiding direction, the flux of charged particles is concentrated (see FIG. 3) on the substrate 18 as is indicated by the position of the visually observed glow region 31. The thermal effect of such an aiding field is illustrated by curve 52 of FIG. 5, produced under otherwise similar circumstances to curve 51. If the magnetic field produced by the auxiliary magnet 19 is in a field opposing relationship to the fringing field of the source magnet 16, the charged particles are deflected from the substrate 18 as signified in FIG. 4 by the lifting of the glow region 41 away from the substrate 18. The thermal effect of this situation is illustrated by curve 53 of FIG. 5 which shows a significant reduction in the heating of the substrate 18. In order to materially affect the charged particle flux, the magnetic field produced by the auxiliary magnet 19 at the substrate must be of the same order as the fringing field of the source magnet (e.g., $10^{-2}$ w/m²) or greater than the fringing field. The magnet used to produce the curves of FIG. 5, produced a field of ~0.1 w/m² at the substrate.

EXAMPLES

1. Copper films of resistivity only twice bulk resistivity were produced using an aiding magnetic field to increase the charged particle flux. Using a magnet field aided sputtering source, copper was sputtered at a rate of approximately 330 Angstroms per minute for 15 minutes onto a glass substrate. Without any auxiliary field a film of resistivity 38 $\mu\Omega$-cm was produced and a substrate temperature of 64° C was observed. With an aiding auxiliary field during sputtering, a film of resistivity 3.5 $\mu\Omega$-cm was produced and a substrate temperature of 142° C was observed. Similar results in gold films were observed.

2. With the use of an auxiliary magnetic field in the field opposing configuration, layers of indium tin oxide having sheet resistance of the order of 10 ohms per square were sputtered on thermally sensitive polymeric materials, such as poly(methylmethacrylate), LEXAN, MYLAR and KAPTON and also in glycol phthalate. These depositions resulted in no significant substrate deterioration.

What is claimed is:

1. Method for the sputter deposition of a layer on a substrate comprising placing the substrate in the particle beam of a magnetic field aided sputtering source, which said substrate is situated in the residual magnetic field of the sputtering source CHARACTERIZED IN THAT the residual magnetic field is reduced by means of a second magnetic field of the same order of intensity or greater than said residual magnetic field, and, corresponding in geometry to said residual magnetic field, whereby the flux of charged particles incident on the substrate is reduced said second magnetic field being produced by an auxiliary magnet means situated below the plane of said substrate, opposite said source.

2. Method of claim 1 in which the auxiliary magnet means includes a permanent magnet.

3. Method of claim 2 in which the permanent magnet is ring shaped with magnetization perpendicular to the plane of the ring.

4. Method of claim 1 in which the layer is metallic.

5. Method of claim 1 in which the layer is semiconductive.

6. Method of claim 1 in which the layer is insulating.

* * * * *